US007825834B2

(12) United States Patent
Kim et al.

(10) Patent No.: US 7,825,834 B2
(45) **Date of Patent: *Nov. 2, 2010**

(54) SCALABLE AUDIO DATA ARITHMETIC DECODING METHOD, MEDIUM, AND APPARATUS, AND METHOD, MEDIUM, AND APPARATUS TRUNCATING AUDIO DATA BITSTREAM

(75) Inventors: Junghoe Kim, Seoul (KR); Eunmi Oh, Seoul (KR); Changyong Son, Gunpo-si (KR); Kihyun Choo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/000,671

(22) Filed: Dec. 14, 2007

(65) Prior Publication Data

US 2008/0122668 A1 May 29, 2008

Related U.S. Application Data

(63) Continuation of application No. 11/330,168, filed on Jan. 12, 2006, now Pat. No. 7,330,139.

(60) Provisional application No. 60/643,118, filed on Jan. 12, 2005, provisional application No. 60/670,643, filed on Apr. 13, 2005, provisional application No. 60/673,363, filed on Apr. 21, 2005.

(30) Foreign Application Priority Data

Nov. 18, 2005 (KR) ..................... 10-2005-0110878

(51) Int. Cl.
*H03M 7/00* (2006.01)

(52) U.S. Cl. .......................... 341/107; 341/51; 341/67; 341/106; 704/212; 704/500; 704/501; 704/503; 704/504

(58) Field of Classification Search .................. 341/51, 341/67, 106, 107; 704/212, 500–504
See application file for complete search history.

(56) References Cited

U.S. PATENT DOCUMENTS 5,592,163 A * 1/1997 Kimura et al. .............. 341/107

(Continued)

FOREIGN PATENT DOCUMENTS

GB 2280816 2/1995

OTHER PUBLICATIONS

Eunmi Oh et al., "Improvement of coding efficiency in MPEG-4 audio scalable lossless coding (SLS)" Dec. 2003.

(Continued)

*Primary Examiner*—Linh V Nguyen
(74) *Attorney, Agent, or Firm*—Staas & Halsey LLP

(57) ABSTRACT

A scalable audio data arithmetic decoding method, medium, and apparatus, and a method, medium, and apparatus truncating an audio data bitstream. The arithmetic decoding method of decoding a scalable arithmetic coded symbol may include arithmetic decoding of a symbol by using the symbol and a probability value for the symbol desired to be decoded, and determining whether or not to continue decoding by checking an ambiguity indicating whether or not decoding of the symbol to be decoded is completed. According to a method, medium, and apparatus of the present invention, data to which scalability is applied when arithmetic coding is performed in MPEG-4 scalable lossless audio coding can be efficiently decoded. Even when a bitstream is truncated, a decoding termination point can be known such that additional decoding of the truncated part can be performed.

10 Claims, 7 Drawing Sheets

U.S. PATENT DOCUMENTS

| | | | | |
|---|---|---|---|---|
| 6,108,622 | A | 8/2000 | Xue et al. | |
| 6,122,618 | A | 9/2000 | Park | |
| 6,229,463 | B1 * | 5/2001 | Van Der Vleuten et al. | 341/107 |
| 6,275,176 | B1 * | 8/2001 | Bruekers et al. | 341/107 |
| 6,349,284 | B1 | 2/2002 | Park | |
| 6,385,588 | B2 * | 5/2002 | Van Der Vleuten | 704/504 |
| 6,765,510 | B2 * | 7/2004 | Koyama et al. | 341/51 |
| 7,006,702 | B2 | 2/2006 | Kondo | |
| 7,079,050 | B2 * | 7/2006 | Van Der Vleuten et al. | 341/50 |
| 7,330,139 | B2 * | 2/2008 | Kim et al. | 341/107 |
| 7,388,526 | B2 * | 6/2008 | Sekiguchi et al. | 341/107 |
| 7,408,488 | B2 * | 8/2008 | Sekiguchi et al. | 341/107 |
| 7,421,138 | B2 * | 9/2008 | Van Der Vleuten | 382/244 |
| 7,460,041 | B2 * | 12/2008 | Yang et al. | 341/107 |
| 7,518,537 | B2 * | 4/2009 | Sekiguchi et al. | 341/107 |
| 2002/0006225 | A1 | 1/2002 | Kimura et al. | |
| 2003/0187634 | A1 | 10/2003 | Li | |
| 2007/0016427 | A1 | 1/2007 | Thumpudi et al. | |
| 2007/0040708 | A1 * | 2/2007 | Senda | 341/50 |
| 2007/0115153 | A1 | 5/2007 | Choo et al. | |
| 2008/0158027 | A1 * | 7/2008 | Sekiguchi et al. | 341/107 |

OTHER PUBLICATIONS

Rongshan Yu et al., “Advanced Audio Zip—A Scalable Perceptual and Lossless Audio Codec” Dec. 2002.
KR Korean Language Abstract of 10-1999-0041073 published Jun. 1999 and related to above reference AD.
Korean Search Report issued Apr. 21, 2006.
European Search Report issued Nov. 9, 2006 for related European Patent Application No. EP 06250140.8-2218.
U.S. Notice of Allowance mailed Sep. 14, 2007 for Parent Appl. No. 11/330,168.

* cited by examiner

FIG. 3 (PRIOR ART)

```
int ac_decode_symbol (ac_coder *ac, int freq)
{
  long range;
  long cum;
  int sym;
  int i;

  range = (long)(ac->high-ac->low)+1;
  cum = ((long)((ac->value-ac->low)+1)<<PRE_SHT);
  if (cum<(range)*freq+1)
  {
 sym = 1;
  ac->high = ac->low + (range*freq>>PRE_SHT)-1;
  }
  else
  {
 sym = 0;
    ac->low = ac->low + (range*freq>>PRE_SHT);
  }

  for (;;) {
    if (ac->high<HALF_VALUE) {
      /* do nothing */
    } else if (ac->low>=HALF_VALUE) {
      ac->value -= HALF_VALUE;
      ac->low -= HALF_VALUE;
      ac->high -= HALF_VALUE;
    } else if (ac->low>=QTR_VALUE && ac->high<TRDQTR_VALUE) {
      ac->value -= QTR_VALUE;
      ac->low -= QTR_VALUE;
      ac->high -= QTR_VALUE;
    } else
      break;
    ac->low = 2*ac->low;
    ac->high = 2*ac->high+1;
    ac->value = 2*ac->value + input_bit(ac);
  }

  return sym;
}
```

FIG. 8

ORIGINAL SAMPLES

| | | | | | | | | | |
|---|---|---|---|---|---|---|---|---|---|
| MSB | 0 | 0 | 0 | 1 | 0 | 0 | 0 | 0 | 0 |
| | 1 | 1 | 0 | 0 | 0 | 0 | 1 | 0 | 0 |
| | 1 | 0 | 0 | 0 | 0 | 0 | 0 | 0 | 1 |
| | 0 | 0 | 0 | 0 | 0 | 1 | 1 | 0 | 1 |
| | 0 | 0 | 0 | 1 | 0 | 1 | 1 | 1 | 0 |
| | 0 | 0 | 1 | 1 | 1 | 1 | 0 | 0 | 0 |
| LSB | 0 | 0 | 1 | 1 | 0 | 0 | 0 | 0 | 1 |
| | 48 | 32 | 3 | 71 | 2 | 14 | 44 | 4 | 25 |

DECODING RESULT OF CONVENTIONAL METHOD

| | | | | | | | | | |
|---|---|---|---|---|---|---|---|---|---|
| MSB | 0 | 0 | 0 | 1 | 0 | 0 | 0 | 0 | 0 |
| | 1 | 1 | 0 | 0 | 0 | 0 | 1 | 0 | 0 |
| | 1 | 0 | 0 | 0 | 0 | 0 | 0 | 0 | 1 |
| | 0 | X | X | X | X | X | X | X | X |
| | X | X | X | X | X | X | X | X | X |
| | X | X | X | X | X | X | X | X | X |
| LSB | X | X | X | X | X | X | X | X | X |
| | 48 | 32 | 0 | 64 | 0 | 0 | 32 | 0 | 16 |

DECODING RESULT OF METHOD OF PRESENT INVENTION

| | | | | | | | | | |
|---|---|---|---|---|---|---|---|---|---|
| MSB | 0 | 0 | 0 | 1 | 0 | 0 | 0 | 0 | 0 |
| | 1 | 1 | 0 | 0 | 0 | 0 | 1 | 0 | 0 |
| | 1 | 0 | 0 | 0 | 0 | 0 | 0 | 0 | 1 |
| | 0 | 0 | 0 | 0 | 0 | 1 | 1 | X | X |
| | X | X | X | X | X | X | X | X | X |
| | X | X | X | X | X | X | X | X | X |
| LSB | X | X | X | X | X | X | X | X | X |
| | 48 | 32 | 0 | 64 | 0 | 8 | 40 | 0 | 16 |

ADDITIONALLY DECODED SYMBOLS

SCALABLE AUDIO DATA ARITHMETIC DECODING METHOD, MEDIUM, AND APPARATUS, AND METHOD, MEDIUM, AND APPARATUS TRUNCATING AUDIO DATA BITSTREAM

CROSS-REFERENCE TO RELATED APPLICATIONS

This application is a Continuation Application of U.S. application Ser. No. 11/330,168, filed Jan. 12, 2006, now U.S. Pat. No. 7,330,139 and claims the benefit of U.S. Provisional Patent Application Nos. 60/643,118, filed on Jan. 12, 2005, 60/670,643, filed on Apr. 13, 2005, and 60/673,363, filed on Apr. 21, 2005, in the U.S. Patent and Trademark Office, and Korean Patent Application No. 10-2005-0110878, filed on Nov. 18, 2005, in the Korean Intellectual Property Office, the disclosures of which are incorporated herein in their entirety by reference.

BACKGROUND OF THE INVENTION

1. Field of the Invention

Embodiments of the present invention relate to scalable audio data decoding, and more particularly, to a scalable audio data arithmetic decoding method, medium, and apparatus, and a method, medium, and apparatus truncating an audio data bitstream.

2. Description of the Related Art

Audio lossless encoding techniques have been required for audio broadcasting and/or archiving purposes. Major technologies for lossless audio encoding include application of an entropy encoder using time/frequency transformation or linear prediction, for example.

When scalability through bitstream re-parsing is applied, for example, a bitstream corresponding to a frame is truncated at an arbitrary position, at a server end, and transmitted to a decoding end.

FIG. 1 illustrates a conventional arithmetic decoding method.

First, initialization is performed, in operation 100, and a symbol desired to be decoded is detected, in operation 110. By using the corresponding context, a probability value for the symbol can be calculated, in operation 120, and arithmetic decoding can then be performed, in operation 130. Here, the probability value for a symbol corresponds to the probability that a symbol is a '1' or '0', for example where the symbol is a binary number. Whether the symbol is the end of the bitstream can then be checked, in operation 140, and if the symbol is not the end of the bitstream, a symbol to be decoded can again be determined and the above operations may be repeated. The decoding is finished when the symbol is determined to be the end of the bitstream.

Meanwhile, when an arithmetic decoding method is performed, all of the symbols to be decoded are known, or a predetermined termination code is inserted, and the decoder is informed of the time when the decoding should be finished. However, when a bitstream is truncated, as shown in FIG. 2, this information, indicating the termination code, is cut off and the decoder cannot know when to finish the decoding. Thus, since the accurate termination time is not known, data that is not desired may be decoded.

SUMMARY OF THE INVENTION

Embodiments of the present invention, as set forth herein, include a scalable audio data arithmetic decoding method, medium, and apparatus capable of efficiently terminating decoding without decoding errors.

Embodiments of the present invention also include a method, medium, and apparatus truncating a scalable audio data bitstream.

To achieve the above and/or other aspects and advantages, embodiments of the present invention include a scalable data arithmetic decoding method for decoding a scalable arithmetic coded symbol, including arithmetic decoding a desired symbol by using the symbol and a probability value for the symbol, and determining whether to continue a decoding of the symbol by checking for an ambiguity indicating whether the decoding of the symbol is complete, wherein, in the determining of whether to continue the decoding, when a valid bitstream remaining after truncation is decoded and then decoding is performed by using dummy bits in order to decode the bitstream, truncated for scalability, if the symbol is decoded regardless of the dummy bits, the decoding is continuously performed, and if the symbol is decoded relying on the dummy bits, and it is determined that the ambiguity occurs, then the decoding is correspondingly terminated.

The determining of whether to continue decoding may include calculating K, assuming that K is a right-hand side value of a following equation:

$$v2 < \frac{(\text{high} - \text{low} + 1) \cdot freq}{2^{14}} - v1 + \text{low} - 1$$

$$v2 \geq \frac{(\text{high} - \text{low} + 1) \cdot freq}{2^{14}} - v1 + \text{low} - 1$$

This may further include determining, according to a value of K, whether to continue the decoding, where in these equations, v1 denotes a value of the valid bitstream remaining after truncation, v2 denotes a value of the truncated bitstream after the truncation, dummy denotes a number of v2 bits, freq denotes the probability value for the symbol, high and low denote an upper limit and a lower limit, respectively, of a range in which the probability value exists, decoding the symbol as 1 if K is equal to or greater than $2^{dummy}-1$, and decoding the symbol as 0 if K is equal to or less than 0, and determining that the ambiguity occurs, if K is between 0 and $2^{dummy}-1$, and correspondingly terminating the decoding.

Before the arithmetic decoding of the symbol, the method may include finding the symbol, and calculating the probability value for the symbol.

The calculation of the probability value for the symbol may include finding a decoding mode from header information of a bitstream to be decoded, and obtaining the probability value for the symbol by referring to a context of the symbol if the decoding mode is a context-based arithmetic coding mode (cbac).

In the arithmetic decoding of the symbol, if a first non-zero sample on a bitplane is decoded, a sign bit corresponding to the sample may be arithmetic decoded, and in the determining that the ambiguity occurs, if K is between 0 and $2^{dummy}-1$, the ambiguity may have been determined to have occurred, and the decoding may be terminated by setting a sample, decoded immediately before the ambiguity, to 0.

The calculation of the probability value for the symbol may include finding a decoding mode from header information of a bitstream to be decoded, and if the decoding mode is a bitplane Golomb mode (bpgc), obtaining the probability value for the symbol, assuming that the data to be decoded has a Laplacian distribution.

In the arithmetic decoding of the symbol, if a first non-zero sample on a bitplane is decoded, a sign bit corresponding to the sample may be arithmetically decoded, and, in the determining that the ambiguity occurs, if K is between 0 and $2^{dummy}-1$, the ambiguity may be determined to have occurred, and the decoding is terminated with setting a sample, decoded immediately before the ambiguity, to 0.

The calculation of the probability value for the symbol may further include finding a decoding mode from header information of a bitstream to be decoded, and if the decoding mode is a low energy mode, obtaining the probability value for the symbol by using probability model information of the bitstream header.

To achieve the above and/or other aspects and advantages, embodiments of the present invention include a scalable data arithmetic decoding apparatus to decode a scalable arithmetic coded symbol, including a symbol decoding unit to arithmetic decode a desired symbol by using the symbol and a probability value for the symbol, and an ambiguity checking unit to determine whether to continue a decoding by checking for an ambiguity, the ambiguity checking unit including a decoding continuation determination unit to calculate K, assuming that K is a right-hand side value of a following equation, and according to a value of K, determining whether to continue decoding:

$$v2 < \frac{(\text{high} - \text{low} + 1) \cdot freq}{2^{14}} - v1 + \text{low} - 1$$

$$v2 \geq \frac{(\text{high} - \text{low} + 1) \cdot freq}{2^{14}} - v1 + \text{low} - 1$$

Here, v1 denotes a value of a valid bitstream remaining after truncation, v2 denotes a value of a truncated bitstream after the truncation, dummy denotes a number of v2 bits, freq denotes the probability value for the symbol, high and low denote an upper limit and lower limit, respectively, of a range in which the probability value exists. The apparatus may further include an additional decoding unit to decode the symbol as 1 if K is equal to or greater than $2^{dummy}-1$, and to decode the symbol as 0 if K is equal to or less than 0, and a decoding termination unit to determine that the ambiguity occurs if K is between 0 and $2^{dummy}-1$, and to correspondingly terminate the decoding.

The apparatus may further include a symbol determination/probability prediction unit to find the symbol and to calculate the probability value for the symbol.

To achieve the above and/or other aspects and advantages, embodiments of the present invention include a method of truncating a scalable data bitstream including parsing a length of the bitstream, from a header of the bitstream, calculating bytes corresponding to a target bitrate by reading the bitstream, modifying the bitstream length with a smaller value between the calculated target bytes and an actual number of bits, and storing and transmitting a truncated bitstream based on the bitstream and the target length.

To achieve the above and/or other aspects and advantages, embodiments of the present invention include a scalable audio data arithmetic decoding method for decoding a scalable audio arithmetic coded symbol, including arithmetic decoding a desired symbol by using the symbol and a probability value for the symbol, and determining whether to continue a decoding of the symbol by checking for an ambiguity indicating whether the decoding of the symbol is complete, wherein the determining of whether to continue the decoding may include calculating K, assuming that K is a right-hand side value of following equation:

$$v2 < \frac{(\text{high} - \text{low} + 1) \cdot freq}{2^{14}} - v1 + \text{low} - 1$$

$$v2 \geq \frac{(\text{high} - \text{low} + 1) \cdot freq}{2^{14}} - v1 + \text{low} - 1$$

Here, the method may further include determining, according to a value of K, whether to continue decoding, where in these equations, v1 denotes a value of a valid bitstream remaining after truncation, v2 denotes a value of a truncated bitstream after the truncation, dummy denotes a number of v2 bits, freq denotes the probability value for the symbol, high and low denote an upper limit and a lower limit, respectively, of a range in which the probability value exists, decoding the symbol as 1 if K is equal to or greater than $2^{dummy}-1$, and decoding the symbol as 0 if K is equal to or less than 0, and determining that the ambiguity occurs, if K is between 0 and $2^{dummy}-1$, and correspondingly terminating the decoding.

To achieve the above and/or other aspects and advantages, embodiments of the present invention include a scalable audio data arithmetic decoding method for decoding a scalable audio arithmetic coded symbol, including arithmetic decoding a desired symbol by using the symbol and a probability value for the symbol wherein, in the calculation of the probability value for the symbol, a decoding mode is found from header information of a bitstream to be decoded and if the decoding mode is a context-based arithmetic coding mode (cbac), the probability value for the symbol is obtained by referring to a context of the symbol, and determining whether to continue the decoding of the symbol by checking for an ambiguity indicating whether decoding of a symbol is complete, wherein the determining of whether to continue decoding includes calculating K, assuming that K is a right-hand side value of a following equations:

$$v2 < \frac{(\text{high} - \text{low} + 1) \cdot freq}{2^{14}} - v1 + \text{low} - 1$$

$$v2 \geq \frac{(\text{high} - \text{low} + 1) \cdot freq}{2^{14}} - v1 + \text{low} - 1$$

Here, the method may further include the determining, according to a value of K, whether to continue decoding, where in the equations, v1 denotes a value of a valid bitstream remaining after truncation, v2 denotes a value of a truncated bitstream after the truncation, dummy denotes a number of v2 bits, freq denotes the probability value for the symbol, high and low denote an upper limit and a lower limit, respectively, of a range in which the probability value exists, decoding the symbol as 1 if K is equal to or greater than $2^{dummy}-1$, and decoding the symbol as 0 if K is equal to or less than 0, and determining that the ambiguity occurs, if K is between 0 and $2^{dummy}-1$, and correspondingly terminating the decoding.

In the arithmetic decoding of the symbol, if a first non-zero sample on a bitplane is decoded, a sign bit corresponding to the sample may be arithmetically decoded, and, in the determining that the ambiguity occurs, if K is between 0 and $2^{dummy}-1$, the ambiguity may be determined to have occurred, and the decoding is correspondingly terminated by setting a sample, decoded immediately before the ambiguity, to 0.

To achieve the above and/or other aspects and advantages, embodiments of the present invention include a scalable audio data arithmetic decoding method for decoding a scalable audio arithmetic coded symbol, including arithmetic decoding a desired symbol by using the symbol and a probability value for the symbol, wherein, in the calculation of the probability value for the symbol, a decoding mode is found from header information of a corresponding bitstream to be decoded and if the decoding mode is a bitplane Golomb mode (bpgc), the probability value for the symbol is obtained assuming that data to be decoded has a Laplacian distribution, and determining whether to continue decoding by checking for an ambiguity indicating whether the decoding of a symbol is complete, wherein the determining of whether to continue decoding includes calculating K, assuming that K is a right-hand side value of a following equation:

$$v2 < \frac{(\text{high} - \text{low} + 1)\cdot freq}{2^{14}} - v1 + \text{low} - 1$$

$$v2 \geq \frac{(\text{high} - \text{low} + 1)\cdot freq}{2^{14}} - v1 + \text{low} - 1$$

Here, the method may further include determining, according to a value of K, whether to continue decoding, where in these equations, v1 denotes a value of a valid bitstream remaining after truncation, v2 denotes a value of a truncated bitstream after the truncation, dummy denotes a number of v2 bits, freq denotes the probability value for the symbol, high and low denote an upper limit and a lower limit, respectively, of a range in which the probability value exists, decoding the symbol as 1 if K is equal to or greater than $2^{dummy}-1$, and decoding the symbol as 0 if K is equal to or less than 0, and determining that the ambiguity occurs, if K is between 0 and $2^{dummy}-1$, and correspondingly terminating the decoding.

In the arithmetic decoding of the symbol, if a first non-zero sample on a bitplane is decoded, a sign bit corresponding to the sample may be arithmetically decoded, and wherein the determining that the ambiguity occurs, if K is between 0 and $2^{dummy}-1$, the ambiguity may be determined to have occurred, and the decoding is correspondingly terminated with setting a sample, decoded immediately before the ambiguity, to 0.

To achieve the above and/or other aspects and advantages, embodiments of the present invention include a scalable audio data arithmetic decoding method for decoding a scalable audio arithmetic coded symbol, including arithmetic decoding a desired symbol by using the symbol and a probability value for the symbol, wherein, in the calculation of the probability value for the symbol, a decoding mode is found from header information of a corresponding bitstream to be decoded and if the decoding mode is a low energy mode, the probability value for the symbol is obtained by using probability model information of the bitstream header, and determining whether to continue decoding by checking for an ambiguity indicating whether decoding of the symbol is complete, wherein the determining of whether to continue decoding includes calculating K, assuming that K is a right-hand side value of a following equation:

$$v2 < \frac{(\text{high} - \text{low} + 1)\cdot freq}{2^{14}} - v1 + \text{low} - 1$$

$$v2 \geq \frac{(\text{high} - \text{low} + 1)\cdot freq}{2^{14}} - v1 + \text{low} - 1$$

Here, the method may further include determining, according to the K value, whether to continue decoding, where in the equations, v1 denotes a value of a valid bitstream remaining after truncation, v2 denotes a value of a truncated bitstream after the truncation, dummy denotes a number of v2 bits, freq denotes the probability value for the symbol, high and low denote an upper limit and a lower limit, respectively, of a range in which the probability value exists, decoding the symbol as 1 if K is equal to or greater than $2^{dummy}-1$, and decoding the symbol as 0 if K is equal to or less than 0, and determining that the ambiguity occurs, if K is between 0 and $2^{dummy}-1$, and correspondingly terminating the decoding.

To achieve the above and/or other aspects and advantages, embodiments of the present invention include a method of truncating a scalable data bitstream, including parsing a length of the bitstream from a header of the bitstream, calculating target bytes corresponding to a target bitrate by reading the bitstream, modifying the bitstream length with a smaller value between the calculated target bytes and the actual number of bits, storing and transmitting a truncated bitstream based on the bitstream and the target length, wherein the target bytes are obtained using a following equation:

target_bits=(int)(target_bitrate/2*1024.*osf/sampling_rate+0.5)−16; and target_bytes=(target_bits+7)/8.

Here, target_bitrate denotes a desired target bitrate in bits/sec, sampling_rate denotes a sampling frequency of an input audio signal in Hz, and osf denotes an oversampling factor having any one value of 1, 2, and 4.

To achieve the above and/or other aspects and advantages, embodiments of the present invention include a medium including computer readable code to implement an embodiment of the present invention.

Additional aspects and/or advantages of the invention will be set forth in part in the description which follows and, in part, will be apparent from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 3 illustrates a pseudo code for conventional binary arithmetic decoding;

FIG. 8 illustrates additional decoding applying a determining of whether to continue to restore a scalable bitstream, according to an embodiment of the present invention;

DETAILED DESCRIPTION OF THE PREFERRED EMBODIMENTS

Figure 1:
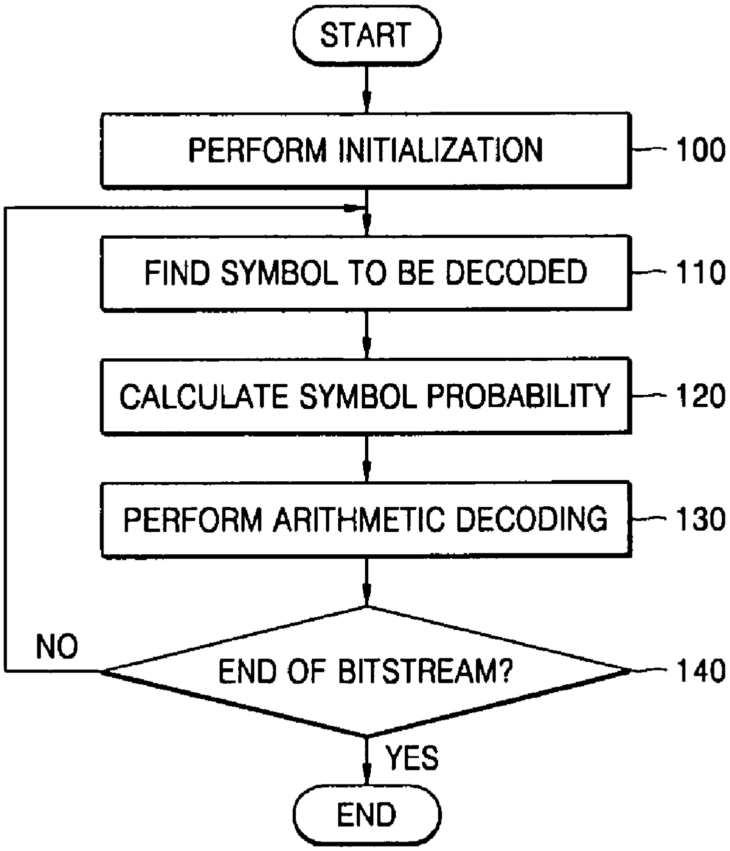
FIG. 1 (PRIOR ART)
FIG. 1 illustrates a conventional arithmetic decoding method.
Figure 2:
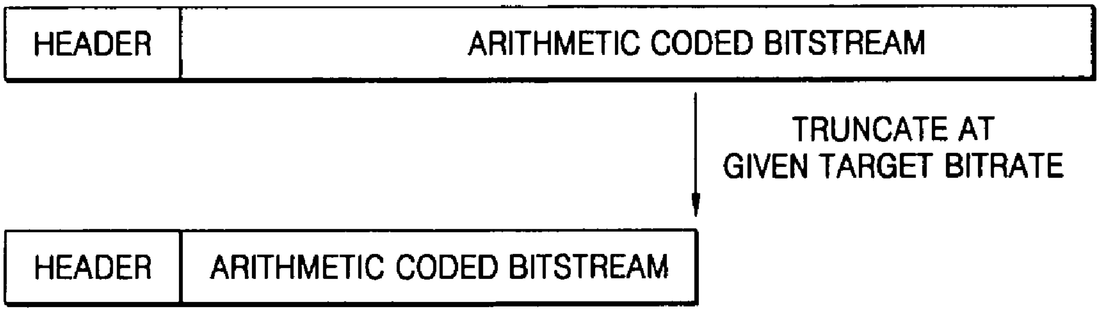
FIG. 2 (PRIOR ART)
FIG. 2 illustrates bitstream truncation for ordinary scalability.

Reference will be made in detail to embodiments of the present invention, examples of which are illustrated in the accompanying drawings, wherein like reference numerals refer to the like elements throughout. Embodiments are described below to explain the present invention by referring to the figures.

Accordingly, a scalable audio data arithmetic decoding method, medium, and apparatus, and a method, medium, and apparatus truncating an audio data bitstream according to embodiments of the present invention will now be described in greater detail.

FIG. 3 illustrates a pseudo code for conventional binary arithmetic decoding. This is an arithmetic decoding algorithm that may be used in an entropy coder of MPEG-4 scalable lossless audio coding.

According to the pseudo code shown in FIG. 3, a decoded symbol is determined by current values of frequency, low, high, and value and then resealing and updating of values of low, high, and value are performed.

Figure 4:
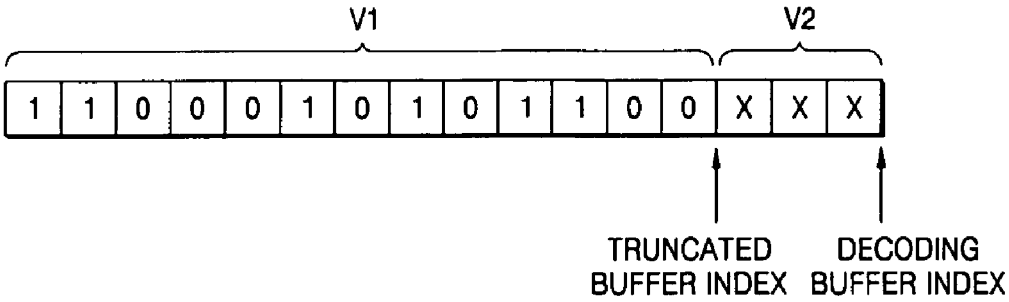
FIG. 4 illustrates a value input in a buffer, near a truncation point, when a bitstream is truncated.

FIG. 4 illustrates a value input to a buffer, near a truncation point, when a bitstream is truncated. Since there is no more meaningful information after a truncated buffer index, the input value is meaningless. Here, this value is referred to as v2 and the value in the remaining part of the buffer is referred to as v1.

According to an embodiment of the present invention, there are 3 bits (dummy bits) in v2, e.g., the value v2 accordingly ranging from 0 to 7.

Figure 5:
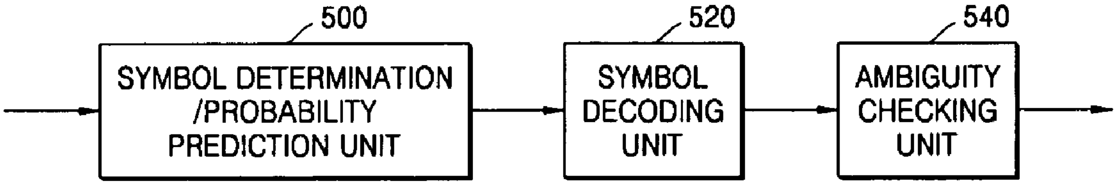
FIG. 5 illustrates an arithmetic decoding apparatus for scalable audio data, according to an embodiment of the present invention.

FIG. 5 illustrates an arithmetic decoding apparatus for scalable audio data, according to an embodiment of the present invention.

The arithmetic decoding apparatus may include a symbol decoding unit 520 and an ambiguity checking unit 540. The arithmetic decoding apparatus may further, for example, include a symbol determination/probability prediction unit 500.

The symbol determination/probability prediction unit 500 identifies a symbol to be decoded in a bitstream and predicts the probability value for the symbol.

Performing the probability prediction for the symbol will now be explained. First, from the header information of the bitstream to be decoded, a decoding mode may be detected. If the decoding mode is a context-based arithmetic coding (cbac) mode, as referred to by the context of the symbol to be decoded, the probability value of the symbol may be obtained. If the decoding mode is a bitplane Golomb coding mode, the probability value for the symbol to be decoded may be obtained by assuming that the data to be decoded has a Laplacian distribution. Also, if the decoding mode is a low energy mode, the probability value for of the symbol to be decoded is obtained by using the probability model information of the bitstream header.

The symbol decoding unit 520 may perform arithmetic decoding of the symbol by using the predicted probability and may then generate the symbol. Decoding of the sign bit on a bitplane will now be explained. In decoding of an MPEG-4 scalable lossless bitstream, a first non-zero sample among values on the bitplane may be decoded, and then, the sign corresponding to the sample may be decoded. However, if an ambiguity error occurs in the sign value and the decoding is immediately terminated because of the occurrence of the ambiguity error, the sign of the non-zero sample that is decoded immediately before cannot be known. For this reason, when the decoding is terminated in the sign bit, the sample decoded immediately before is set to 0 and the decoding is terminated.

Assuming that the right-hand side value of the below Equations 1 and 2 is K, the ambiguity checking unit 540 may calculate K, and according to the value of K, determine whether to continue to decode a symbol:

$$v2 < \frac{(\text{high} - \text{low} + 1) \cdot freq}{2^{14}} - v1 + \text{low} - 1 \tag{1}$$

$$v2 \geq \frac{(\text{high} - \text{low} + 1) \cdot freq}{2^{14}} - v1 + \text{low} - 1 \tag{2}$$

Here, v1 denotes the value of the valid bitstream remaining after truncation, v2 denotes the value of the truncated bitstream after the truncation, dummy denotes the number of v2 bits, freq denotes the probability value for the symbol, high and low denote the upper limit and lower limit of a range in which the probability value for the symbol exists. This is more fully explained in "Study on ISO/IEC 14496-3: 2001/PDAM 5, (Scalable Lossless Coding)", ISO/IEC JTC 1/SC 29/WG 11 N6792.

Equations 1 and 2 will now be explained in greater detail. A decoding expression of the pseudo code shown in FIG. 3 may be divided into v1 and v2 and then expanded.

If $(v1+v2-low+1)\cdot 2^{14} < (high-low+1)\cdot freq$, the symbol (sym) may be generated as having the value of 1. Here, if this is rearranged in relation to v2, Equation 1 is obtained.

Also, if $(v1+v2-low+1)\cdot 2^{14} \geqq (high-low+1)\cdot freq$, the symbol (sym) may be generated as having the value of 0. Here, if this is rearranged in relation to v2, Equation 2 is obtained.

In equation 1, if the value of the right-hand side expression is greater than 7, the symbol may be decoded as 1, regardless of v2. In Equation 2, if the value of the right-hand side expression is less than 0, the symbol may be decoded as 0, regardless of v2. In other cases, a decoding ambiguity occurs and the decoding is finished.

Figure 6:
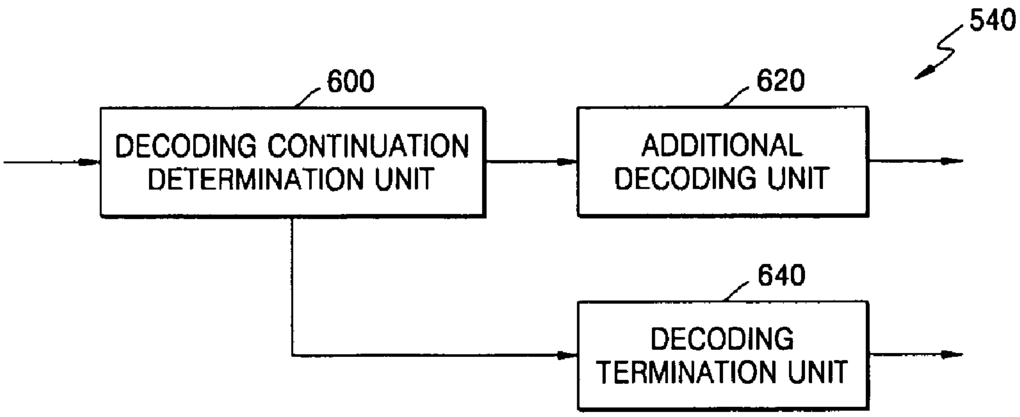
FIG. 6 illustrates an ambiguity checking unit, such as for the arithmetic decoding apparatus of FIG. 5, according to an embodiment of the present invention.

FIG. 6 illustrates an ambiguity checking unit 540, such as for the arithmetic decoding apparatus of FIG. 5, according to an embodiment of the present invention. The ambiguity checking unit 540 may include a decoding continuation determination unit 600, an additional decoding unit 620, and a decoding termination unit 640, for example.

Assuming that the right-hand side value of Equations 1 and 2 is K, the decoding continuation determination unit 600 may calculate the value of K, and according to value of K, determine whether or not to continue to decode a symbol. The additional decoding unit 620 may decode the symbol as 1 if K is equal to or greater than $2^{dummy}-1$, and if K is equal to or less than 0, decode the symbol as 0. If K is between 0 and $2^{dummy}-1$, the decoding termination unit 640 may determine that an ambiguity has occurred, and terminate the decoding.

Figure 7:
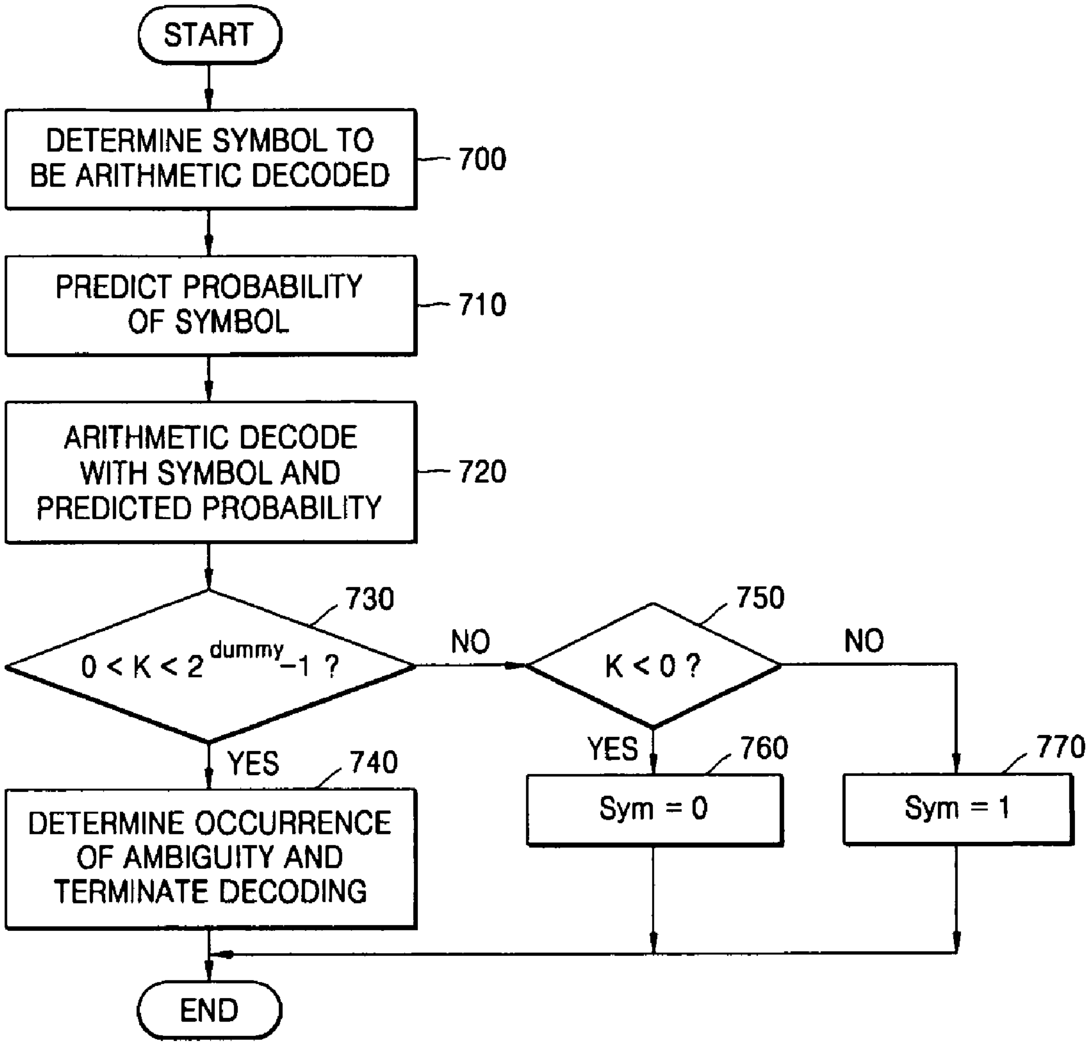
FIG. 7 illustrates arithmetic decoding of scalable audio data, according to an embodiment of the present invention.

FIG. 7 illustrates an arithmetic decoding of scalable audio data, according to an embodiment of the present invention, and referring to FIG. 7, a determining of whether to continue restoration of a scalable bitstream, according to an embodiment the present invention will now be explained in greater detail.

A symbol to be decoded in an arithmetic coded scalable bitstream may be determined, in operation 700, and the probability value for the determined symbol may be predicted, in operation 710.

Performing the probability prediction of the symbol will now be further explained.

From the header information of the bitstream to be decoded, a decoding mode may be determined. If the decoding mode is a context-based arithmetic coding (cbac) mode, e.g., by referring to the context of the symbol to be decoded, the probability value for the symbol may be obtained. If the decoding mode is a bitplane Golomb coding mode, the probability value for the symbol to be decoded may be obtained by assuming that the data to be decoded has a Laplacian distribution. Also, if the decoding mode is a low energy mode, the probability value for the symbol to be decoded may be obtained by using the probability model information of the bitstream header.

By using the predicted probability, the symbol may be arithmetically decoded and generated, in operation 720.

Assuming that the right-hand side value of equations 1 and 2 is K, when K is calculated, if K found to be between 0 and $2^{dummy}-1$, in operation 730, it may be determined that an ambiguity has occurred, and the arithmetic decoding may be determined, in operation 740.

If K is found to be equal to or less than 0, in operation 750, the symbol may be decoded as 0, in operation 760, and if K found to be is equal to or greater than $2^{dummy}-1$, the symbol may be decoded as 1, in operation 770.

FIG. 8 illustrates an additional decoding determining whether to continue to restore a scalable bitstream, according to an embodiment of the present invention. FIG. 8 illustrates 5 samples being additionally decoded.

In the MPEG-4 scalable lossless decoding, a first non-zero sample among values on the bitplane is decoded, then the sign corresponding to the sample is decoded. However, if an ambiguity error occurs in the sign value, and the decoding is immediately terminated because of the occurrence of the ambiguity error, the sign of the non-zero sample that is decoded immediately before cannot be known. For this reason, when the decoding is terminated in the sign bit, the sample decoded immediately before is set to 0 and the decoding is terminated.

Figure 9:
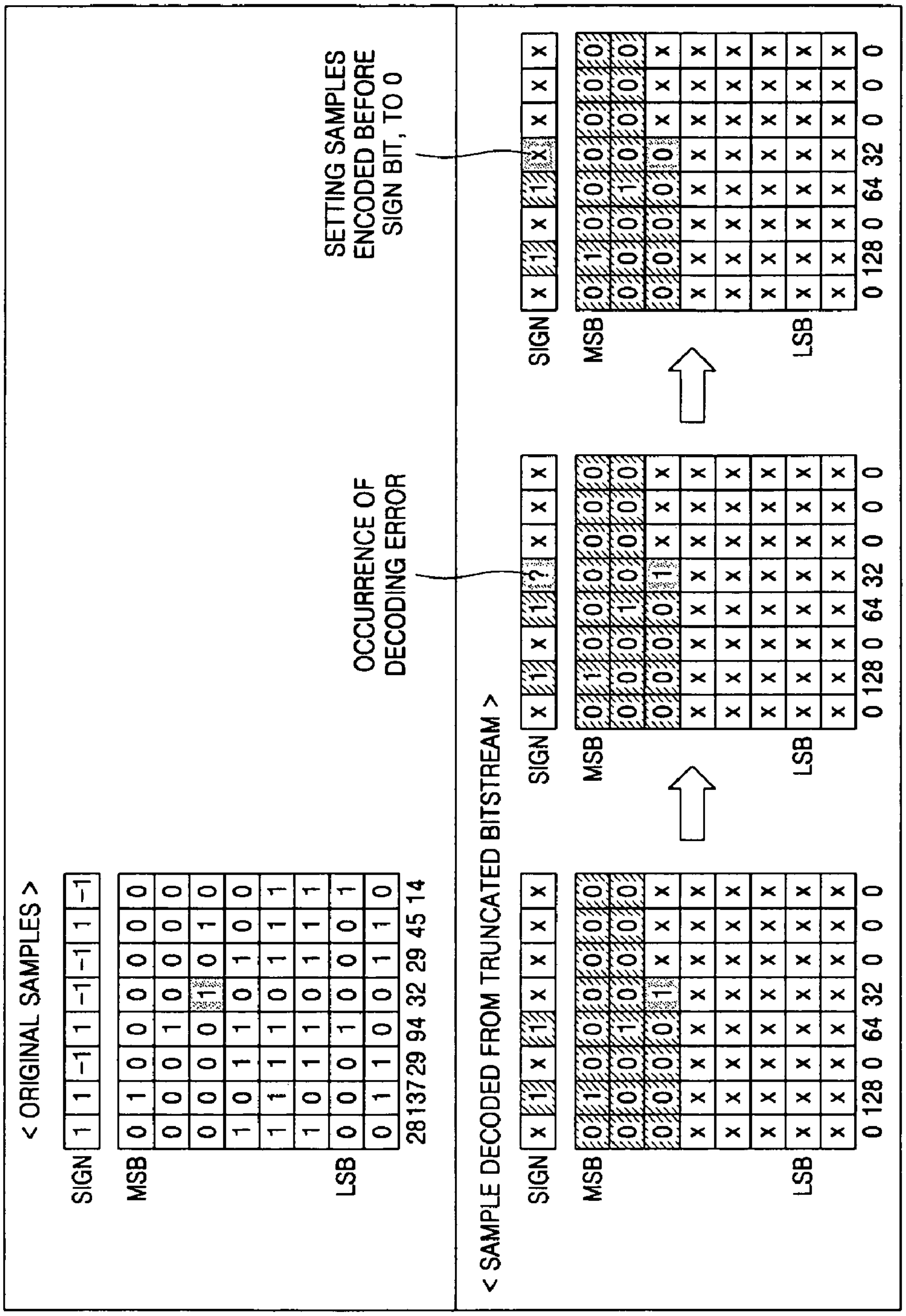
FIG. 9 illustrates processing of an ambiguity occurring in a sign bit, according to an embodiment of the present invention.

FIG. 9 illustrates a processing of an ambiguity occurring in a sign bit, according to an embodiment of the present invention.

First, the pseudo code for arithmetic decoding for each of BPGC, CBAC and low energy modes will now be explained in greater detail. Here, ambiguity_check(f) is a function to detect ambiguity for the arithmetic decoding, with the argument indicating a probability value of 1. The function terminate_decoding( ) is a function to terminate decoding of LLE data when an ambiguity occurs. The function smart_decoding_cbac_bpgc( ) is a function to decode additional symbols in the absence of incoming bits in cbac/bpgc mode decoding. A scalable audio data arithmetic decoding, according to an embodiment of the present invention, continues up to the point where no ambiguity exists. This code (the pseudo code) includes the above functions, ambiguity_check(f) and terminate_decoding( ). In addition, the function smart_decoding_low_energy( ) is a function to decode additional symbols in the absence of incoming bits in the low energy mode. This also includes the functions, ambiguity_check(f) and terminate_decoding( ), see below:

```
while ((max_bp[g][sfb] cur_bp[g][sfb]<LAZY_BP) && (cur_bp[g]sfb] >= 0)){
    for (g=0;g<num_windows_grroup;g++){
        for (sfb = 0;sfb<num_sfb;sfb++){
            if ((cur_bp[g][sfb]>=0) && (lazy_bp[g]p[sfb] > 0)){
                width = swb_offset[g][sfb+1] swb_offset[g][sfb];
                for (win=0;win<window_group_len[g];win++){
                    for (bin=0;bin<width;bin++){
                        if (!is_lle_ics_eof ( )){
                            if (intervaal[g][win][sfb][bin] > res[g][win][sfb][bin] + (1<<cur_bp[g][sfb])
                            {
                                freq = determine_frequency( );
                                res[g][win][sfb][bin] += decode(freq ) << cur_bp[g][sfb];
                                        /* decode bit-plane cur_bp*/
                                if ((!is_sig[g][win][sfb][bin]) && (res[g][win][sfb][bin] )) {
                                        /* decode sign bit of res if necessary */
                                        res[g][win][sfb][bin] *= (decode(freq_sign))? 1:-1;
                                        is_sig[g][win][sfb][bin] = 1;
                                            }
                                        }
                                }
                                else
                                    smart_decoding_cbac_bpgc( );
                                }
                                        }
                                    }
                                    cur_bp[g][sfb]--; /* progress to next bit-plane */
                                }
                    }
                }
}
```

```
        /* low energy mode decoding */
for (g = 0;g < num_windows_group; g++){
    for (sfb = 0; sfb <num_sfb+num_osf_sfb;sfb++){
        if ((cur_bp[g][sfb] >= 0) && (lazy_bp[g][sfb] <= 0))
```

-continued

```
        {
            width = swb__offset[g][sfb+1] swb__offset[g][sfb];
                for (win=0;win<window__group__len[g];win++){
                res[g][sfb][win][bin] = 0;
                    pos = 0;
                    for (bin=0;bin<width;bin++){
                        if (!is__lle__ics__eof ( )){
                                /* decoding of binary string and reconstructing res */
                                while (decode(freq__silence[pos])==1) {
                            res[g][sfb][win][bin] ++;
                                    pos++;
                                    if (pos>2) pos = 2;
                                    if (res[g][sfb][win][bin]==(1<<(max__bp[g][sfb]+1))−1) break;
                                }
                                /* decoding of sign of res */
                                if (!is__sig[g][win][sfb][bin]) && res[g][sfb][win][bin]){
                                    res[g][sfb][win][bin] *= (decode(freq__sign))? −1:1;
                                    is__sig[g][win][sfb][bin] = 1;
                                }
                    }
                    else smart__decoding__low__energy( );
                }
        }
    }
  }
}
```

An arithmetic decoding of the truncated SLS bitstream, according to an embodiment of the present invention, provides an efficient method for decoding an intermediate layer corresponding to a given target bitrate, such that, even when there are no bits input to the decoding buffer, meaningful information is still included in the decoding buffer. The decoding process is performed up to the point where no ambiguity exists in the symbol. The following pseudo code shows an algorithm for detecting an ambiguity in an arithmetic decoding module, according to an embodiment of the present invention. A variable num_dummy_bits indicates the number of bits not input to a value buffer because of truncation.

```
            int ambiguity__check(int freq)
  {
        /* if there is no ambiguity, returns 1 */
        /* otherwise, returns 0              */
```

-continued

```
        upper = 1<<num__dummy__bits;
        decisionVal = ((high−low)*freq>>PRE__SHT)−value+low−1;
        if(decisionVal>upper || decisionVal<0) return 0;
        else return 1;
  }
```

Below, smart_decoding_cbac_bpgc( ) or smart_decoding_low_energy( ) may be performed when num_dummy_bits is greater than 0. In order to prevent sign bit errors, the spectral value of the current spectral line is set to be zero when an ambiguity can occur while decoding a sign bit. All index variables in the arithmetic decoding process according to an embodiment of the present invention are carried over from the previous arithmetic decoding process.

```
                    smart__decoding__cbac__bpgc( )
{
    /* BPGC/CBAC normal decoding with ambiguity detection */
    while ((max__bp[g][sfb] - cur__bp[g][sfb]<LAZY__BP) && (cur__bp[g][sfb] >= 0)){
        for (;g<num__windows__group;g++){
            for (;sfb<num__sfb;sfb++){
                if ((cur__bp[g][sfb]>=0) && (lazy__bp[g][sfb] > 0)){
                    width = swb__offset[g][sfb+1] - swb__offset[g][sfb];
                    for (;win<window__group__len[g];win++){
                    for (;bin<width;bin++){
                        if (interval[g][win][sfb][bin] > res[g][win][sfb][bin] + (1<<cur__bp[g][sfb])
                                {
                                    freq = determine__frequency( );
                                    if (ambiguity__check(freq)) {
                                    /* no ambiguity for arithmetic decoding */
                                    res[g][win][sfb][bin] += decode(freq) << cur__bp[g][sfb];
                                                /* decode bit-plane cur__bp*/
                                    if ((!is__sig[g][win][sfb][bin]) && (res[g][win][sfb][bin] )) {
                                    /* decode sign bit of res if necessary */
                                    if (ambiguity__check(freq)) {
                                    res[g][win][sfb][bin] *= (decode(freq__sign))? 1:−1;
                                    is__sig[g][win][sfb][bin] = 1;
                                                    }
```

-continued

```
                                        else {
                                /* discard the decoded symbol prior to sign symbol */
                                res[g][win][sfb][bin] = 0;
                                    terminate__decoding( );
                                                                }
                                                            }
                                        }
                                        else terminate__decoding( );
                                        }
                                    }
                                }
                cur__bp[g][sfb]--; /* progress to next bit-plane */
            }
        }
    }
}
}
```

```
                                smart__decoding__low__energy( )
{
    /* low energy mode decoding */
    for (;g < num__windows__group; g++){
            for (; sfb <num__sfb+num__osf__sfb;sfb++){
                if ((cur__bp[g][sfb] >= 0) && (lazy__bp[g][sfb] <= 0))
                {
                    width = swb__offset[g][sfb+1] swb__offset[g][sfb];
                    for (;win<window__group__len[g];win++){
                            res[g][sfb][win][bin] = 0;
                                pos = 0;
                            for (;bin<width;bin++){
                                while (1) {
                                    /* if ambiguity check is false, discard the spectrum is set to be 0 */
                                    if(!ambiguity__check(freq)) res[g][sfb][win][bin] = 0, terminate__decoding( );
                                        tmp = decode(freq__silence[pos]);
                                        if(tmp==0)          break;
                                        res[g][sfb][win][bin] ++;
                                        pos++;
                                        if (pos>2) pos = 2;
                                        if (res[g][sfb][win][bin]==(1<<(max__bp[g][sfb]+1))-1) break;
                            }
                            /* decoding of sign of res */
                        if (!is__sig[g][win][sfb][bin]) && res[g][sfb][win][bin]){
                            /* if ambiguity check is false, the current spectrum value is set to be 0 */
                            if(!ambiguity__check(freq)) res[g][sfb][win][bin] = 0, terminate__decoding( );
                                    res[g][sfb][win][bin] *= (decode(freq__sign))? -1:1;
                                    is__sig[g][win][sfb][bin] = 1;
                                    }
                            }
                        }
                    }
                }
        }
}
```

Below, the process of re-parsing and bitstream truncation, when the size of a bitstream is transmitted in the header, according to a method of generating a truncated bitstream by re-parsing will now be explained.

Figure 10:
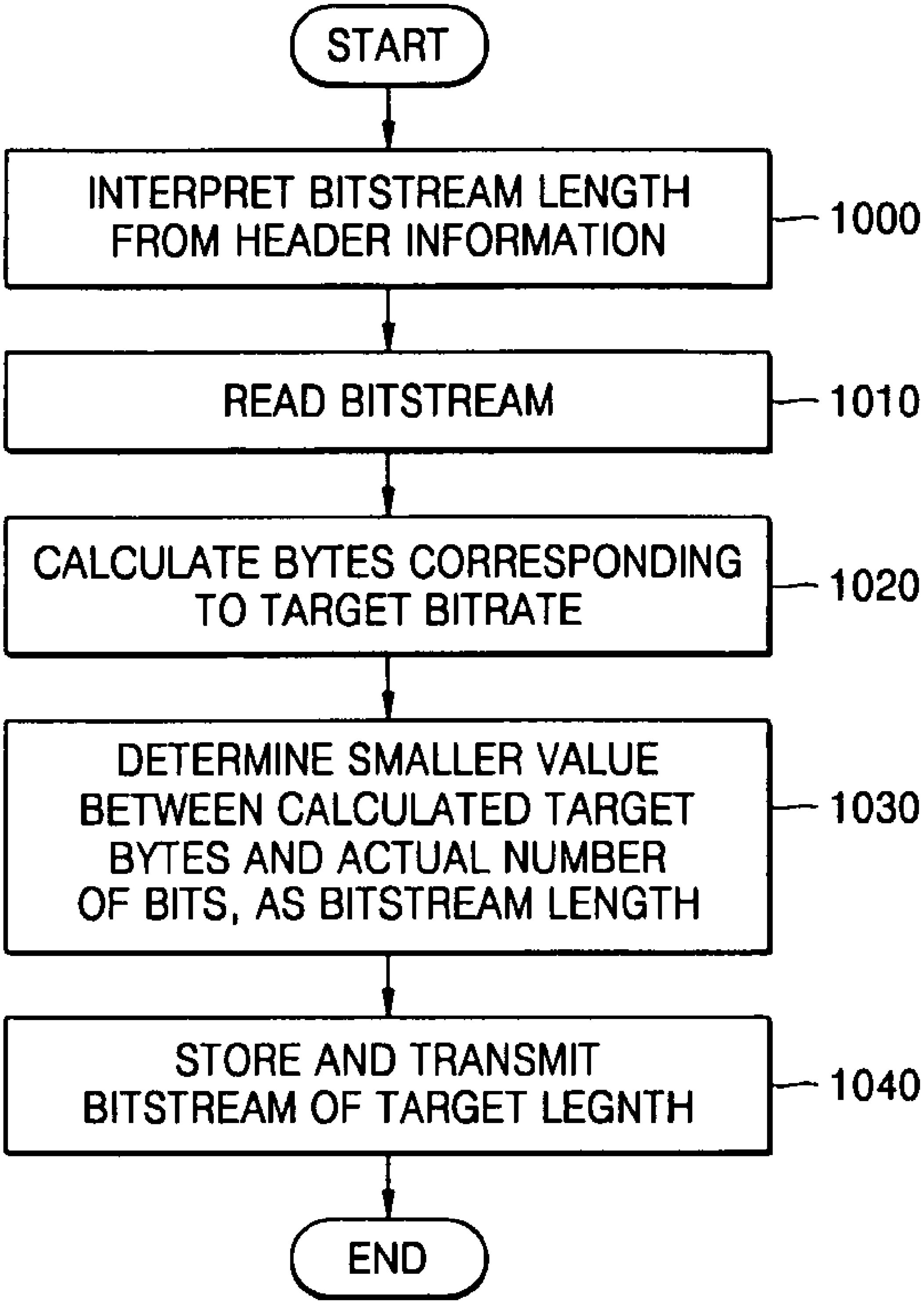
FIG. 10 illustrates truncating of a bitstream of scalable audio data, according to an embodiment of the present invention.

FIG. 10 illustrates a truncating of a bitstream of scalable audio data, according to an embodiment of the present invention. Referring to FIG. 10, the method of truncating a bitstream of the scalable audio data will now be explained in greater detail.

From the bitstream header information, the length of the bitstream may be parsed, in operation 1000. By using the following equations 3 and 4, bytes corresponding to a target bitrate may be calculated, in operation 1020. The target bitrate may be provided from the outside, for example, by a server or a user.

target_bits=(int)(target_bitrate/2*1024.*osf/sampling_rate+0.5)−16 (3)

target_bytes=(target_bits+7)/8 (4)

With the obtained target byte, the bitstream length can be modified. That is, a smaller value between the actual number of bits and the target_bytes is determined as the length of the bitstream, in operation 1030. A bitstream of the target length may also be stored and transmitted, in operation 1040.

The method of re-parsing and truncating the bitstream will now be explained in more detail. The SLS bitstream can be truncated in a given target bitrate in a simple way. The modification of the values of lle_ics_length does not affect LLE decoding results before the truncation point. The lle_ics_length is independent from an LLE decoding procedure. The bitstream truncation will now be explained. The LLE bitstream is read from the bitstream. The available frame length at a given target bitrate is calculated. The simplest way to calculate the available frame length is by using the above Equations 3 and 4.

Here, in Equations 3 and 4, the variable target_bitrate represents the target bitrate in bits/sec, the variable osf represents an oversampling factor, and the variable sampling_rate represents the sampling frequency of the input audio signal in Hz. By taking a smaller value of the available frame length and the current frame length, lle_ics_length may be updated as follows:

lle_ics_length=min(lle_ics_length, target_bytes).

The truncated bitstream with the updated lle_ics_length can be generated.

Embodiments of the present invention can also be embodied as computer readable code in/on a medium, e.g., on a computer readable recording medium. The medium may be any data storage device that can store/transmit data which can be thereafter be read by a computer system. Examples of the media may include read-only memory (ROM), random-access memory (RAM), CD-ROMs, magnetic tapes, floppy disks, and optical data storage devices, noting that these are only examples.

Thus, according to a scalable audio data arithmetic decoding method, medium, and apparatus of the above described embodiments of the present invention, data to which scalability is applied when arithmetic coding is performed in MPEG-4 scalable lossless audio coding can be efficiently decoded. Even when a bitstream is truncated, a decoding termination point can be known such that additional decoding of the truncated part can be performed.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A scalable data arithmetic decoding method for decoding a scalable arithmetic coded symbol, comprising:

arithmetic decoding a desired symbol by using the symbol and a probability for the symbol; and determining whether to continue a decoding of the symbol by checking for an ambiguity indicating whether the decoding of the symbol is complete.

2. The method of claim 1, wherein, in the determining of whether to continue the decoding, when a valid bitstream remaining after truncation is decoded and then decoding is performed by using dummy bits in order to decode the bitstream, truncated for scalability, if the symbol is decoded regardless of the dummy bits, the decoding is continuously performed, and if the symbol is decoded relying on the dummy bits, the decoding is correspondingly terminated.

3. The method of claim 1, wherein the determining of whether to continue decoding comprises:

calculating K, assuming that K is a right-hand side value of a following equation:

$$v2 < \frac{(\text{high} - \text{low} + 1) \cdot freq}{2^{14}} - v1 + \text{low} - 1$$

$$v2 \geq \frac{(\text{high} - \text{low} + 1) \cdot freq}{2^{14}} - v1 + \text{low} - 1$$

determining, according to a value of K, whether to continue the decoding, where in these equations, v1 denotes a value of the valid bitstream remaining after truncation, v2 denotes a value of the truncated bitstream after the truncation, dummy denotes a number of v2 bits, freq denotes the probability value for the symbol, high and low denote an upper limit and a lower limit, respectively, of a range in which the probability value exists;

decoding the symbol as 1 if K is equal to or greater than $2^{dummy}-1$, and decoding the symbol as 0 if K is equal to or less than 0; and determining that the ambiguity occurs, if K is between 0 and $2^{dummy}-1$.

4. The method of claim 3, before the arithmetic decoding of the symbol, further comprising:

finding the symbol; and calculating the probability value for the symbol.

5. The method of claim 4, wherein the calculation of the probability for the symbol comprises:

finding a decoding mode from header information of a bitstream to be decoded; and obtaining the probability for the symbol by referring to a context of the symbol if the decoding mode is a context-based arithmetic coding mode (cbac).

6. The method of claim 5, wherein, in the arithmetic decoding of the symbol, if a first non-zero sample on a bitplane is decoded, a sign bit corresponding to the sample is arithmetic decoded, and in the determining that the ambiguity occurs, if K is between 0 and $2^{dummy}-1$, the ambiguity is determined to have occurred, and the decoding is terminated by setting a sample, decoded immediately before the ambiguity, to 0.

7. The method of claim 4, wherein the calculation of the probability for the symbol comprises:

finding a decoding mode from header information of a bitstream to be decoded; and if the decoding mode is a bitplane Golomb mode (bpgc), obtaining the probability for the symbol, assuming that the data to be decoded has a Laplacian distribution.

8. The method of claim 4, wherein, in the arithmetic decoding of the symbol, if a first non-zero sample on a bitplane is decoded, a sign bit corresponding to the sample is arithmetically decoded, and wherein, in the determining that the ambiguity occurs, if K is between 0 and $2^{dummy}-1$, the ambiguity is determined to have occurred, and the decoding is terminated with setting a sample, decoded immediately before the ambiguity, to 0.

9. The method of claim 4, wherein the calculation of the probability for the symbol comprises:

finding a decoding mode from header information of a bitstream to be decoded; and if the decoding mode is a low energy mode, obtaining the probability for the symbol by using probability model information of the bitstream header.

10. A computer-readable recording medium having embodied thereon a computer program to execute a scalable data arithmetic decoding method for decoding a scalable arithmetic coded symbol, comprising:

arithmetic decoding a desired symbol by using the symbol and a probability for the symbol; and determining whether to continue a decoding of the symbol by checking for an ambiguity indicating whether the decoding of the symbol is complete.

* * * * *